(12) United States Patent
Pan et al.

(10) Patent No.: US 11,374,109 B2
(45) Date of Patent: Jun. 28, 2022

(54) METHOD FOR FABRICATING GATE STRUCTURES

(71) Applicant: United Microelectronics Corp., Hsinchu (TW)

(72) Inventors: Chih-Hao Pan, Kaohsiung (TW); Chi-Cheng Huang, Kaohsiung (TW); Kuo-Lung Li, Tainan (TW); Szu-Ping Wang, Tainan (TW); Po-Hsuan Chen, Tainan (TW); Chao-Sheng Cheng, Taichung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/670,890

(22) Filed: Oct. 31, 2019

(65) Prior Publication Data

US 2021/0134979 A1    May 6, 2021

(51) Int. Cl.
*H01L 29/66* (2006.01)
*H01L 27/1157* (2017.01)

(52) U.S. Cl.
CPC .... *H01L 29/66545* (2013.01); *H01L 27/1157* (2013.01); *H01L 29/66833* (2013.01)

(58) Field of Classification Search
CPC ........... H01L 29/66545; H01L 27/1157; H01L 29/66833
See application file for complete search history.

(56) References Cited

U.S. PATENT DOCUMENTS

| | | | |
|---|---|---|---|
| 8,877,625 B1* | 11/2014 | Lian ................ | H01L 21/823462 438/591 |
| 9,754,955 B2 | 9/2017 | Wu et al. | |
| 2007/0132041 A1* | 6/2007 | Yoon ............... | H01L 21/823462 257/411 |
| 2015/0035079 A1* | 2/2015 | Xie ..................... | H01L 21/2822 257/390 |
| 2016/0035856 A1* | 2/2016 | van Bentum ....... | H01L 29/6684 257/295 |
| 2018/0294261 A1* | 10/2018 | Liang .................. | H01L 29/1095 |

* cited by examiner

*Primary Examiner* — Errol V Fernandes
(74) *Attorney, Agent, or Firm* — J.C. Patents

(57) ABSTRACT

A method for fabricating gate structures includes providing a substrate, configured to have a first region and a second region. Dummy gate structures are formed on the substrate at the first and second regions, wherein each of the dummy gate structures has a first gate insulating layer on the substrate and a dummy gate on the first gate insulating layer. An inter-layer dielectric layer is formed over the dummy gate structures. The inter-layer dielectric layer is polished to expose all of the dummy gates. The dummy gates are removed. The first gate insulating layer at the second region is removed. A second gate insulating layer is formed on the substrate at the second region, wherein the first gate insulating layer is thicker than the second insulating layer. Metal gates are formed on the first and the second insulating layer.

20 Claims, 7 Drawing Sheets

METHOD FOR FABRICATING GATE STRUCTURES

BACKGROUND OF THE INVENTION

Field of the Invention

The invention relates to a semiconductor fabrication technology, in particular, to a method for fabricating gate structures in a semiconductor device.

Description of Related Art

An integrated circuit apparatus usually includes various circuits to perform various functions as designed. In an example, a memory apparatus may include memory devices for store data and the control circuit, that is, core circuit to control the access to the memory devices. For a flash memory device, it usually includes a control gate and a selection gate in operation. The core circuit includes different type of transistors from the memory device. Further, the input/output circuit may also include another type of transistor. These various transistors may have different gate insulating layers but usually need to be fabricated together.

Due to different thicknesses of the gate insulating layers, the various gate structures may not be at the same height under the same fabrication process. Some of the gate structures may not be fabricated as expected and then cause failure for the transistor.

How to assure that the various gate structures corresponding to various function are fabricated together with less probability of failure is still an issue in development.

SUMMARY OF THE INVENTION

The invention provides the fabrication method to fabricate various gate structures together in a semiconductor device, in which gate heights of the gate structures may be same during fabrication process, although the thickness of the gate insulating layer may be different.

In an embodiment, a method for fabricating gate structures is provided. The method comprises providing a substrate, configured to have a first region and a second region. Dummy gate structures are formed on the substrate at the first and second regions, wherein each of the dummy gate structures has a first gate insulating layer on the substrate and a dummy gate on the first gate insulating layer. An inter-layer dielectric layer is formed over the dummy gate structures. The inter-layer dielectric layer is polished to expose all of the dummy gates. The dummy gates are removed. The first gate insulating layer at the second region is removed. A second gate insulating layer is formed on the substrate at the second region, wherein the first gate insulating layer is thicker than the second insulating layer. Metal gates are formed on the first and the second insulating layer.

In an embodiment, as to the method for fabricating gate structures, a thickness difference between the first gate insulating layer and the second gate insulating layer is at least 5 nm.

In an embodiment, as to the method for fabricating gate structures, the first gate insulating layer is an oxide/nitride/oxide layer and the second gate insulating layer is an oxide layer.

In an embodiment, as to the method for fabricating gate structures, the metal gates comprise a control gate on the first gate insulating layer and a selection gate on the second gate insulating layer.

In an embodiment, as to the method for fabricating gate structures, the step of forming the metal gates comprises forming a third gate insulating layer, a work function metal layer and a filling metal layer.

In an embodiment, as to the method for fabricating gate structures, the step of forming the second gate insulating layer comprises forming at least one group of the second gate insulating layers with at least one thickness corresponding to the at least one group.

In an embodiment, as to the method for fabricating gate structures, the at least one group of the second gate insulating layers comprises at least one of a group for an input/output transistor, a group for selection gate of a flash memory cell, a group for a core transistor.

In an embodiment, as to the method for fabricating gate structures, widths for the first gate insulating layer and the second gate insulating layer are same or different.

In an embodiment, as to the method for fabricating gate structures, a structure of the metal gates is a single metal layer or a stack structure.

In an embodiment, as to the method for fabricating gate structures, the step of forming the dummy gate structures comprises forming a spacer on a sidewall of the dummy gate with the first gate insulating layer.

In an embodiment, as to the method for fabricating gate structures, the step of forming the inter-layer dielectric layer comprises forming a liner layer over the dummy gate structures and forming an oxide layer on the liner layer.

In an embodiment, as to the method for fabricating gate structures, the second insulation layer is a thermal oxide layer by a thermal oxidation process on the substrate at the second region after the first gate insulation layer at the second region is removed.

In an embodiment, a method for fabricating gate structures is provided. The method comprises providing a substrate, configured to have a first region and a second region. A charge storage layer is formed on the substrate at the first and second regions, the charge storage layer has a first thickness to serve as a first gate insulating layer. A dummy gate layer is formed on the charge storage layer. The dummy gate layer and the charge storage layer are patterned into dummy gate structures at the first and second regions. A spacer is formed on a sidewall of the dummy gate structures. An inter-layer dielectric layer is formed over the dummy gate structures. The inter-layer dielectric layer is polished to expose all of the dummy gates. The dummy gate layer in the dummy gate structures is removed to expose the charge storage layer. The charge storage layer is removed at the second region. A second gate insulating layer is formed on the substrate at the second region, wherein the charge storage layer is thicker than the second insulating layer. Metal gates are formed on the charge storage layer and the second insulating layer.

In an embodiment, as to the method for fabricating gate structures, a thickness difference between the charge storage layer and the second gate insulating layer is at least 5 nm.

In an embodiment, as to the method for fabricating gate structures, the metal gates comprise a control gate on the charge storage layer and a selection gate on the second gate insulating layer.

In an embodiment, as to the method for fabricating gate structures, the step of forming the second gate insulating layer comprises forming at least one group of the second gate insulating layers with at least one thickness corresponding to the at least one group.

In an embodiment, as to the method for fabricating gate structures, the at least one group of the second gate insulating layers comprises at least one of a group for an input/output transistor, a group for selection gate of a flash memory cell, a group for a core transistor.

In an embodiment, as to the method for fabricating gate structures, widths for the first gate insulating layer and the second gate insulating layer are same or different.

In an embodiment, as to the method for fabricating gate structures, the step of forming the inter-layer dielectric layer comprises forming a liner layer over the dummy gate structures and forming an oxide layer on the liner layer.

In an embodiment, as to the method for fabricating gate structures, the second insulation layer is a thermal oxide layer by a thermal oxidation process on the substrate at the second region after the first gate insulation layer at the second region is removed.

In order to make the aforementioned and other objectives and advantages of the present invention comprehensible, embodiments accompanied with figures are described in detail below.

DESCRIPTION OF THE EMBODIMENTS

In embodiments, methods for fabricating various gate structures together on a substrate are provided. These gate structures for different function may be fabricated with less probability of failure, in which the gate insulating layers for the various gate structures are different in thickness.

Multiple embodiments are provided for description. The invention is not just limited to the embodiments as provided. A suitable combination between the embodiments may also be made.

As looked into by the invention, a semiconductor apparatus usually includes various transistors for performing different functions. Various gate structures usually need to be formed on the same substrate, in which the gate heights during fabrication may be different due to different functions as needed. This issue of different gate heights may cause failure in some fabrication process, such as a polishing process, being globally applied to the various gate structures.

Figure 1A:
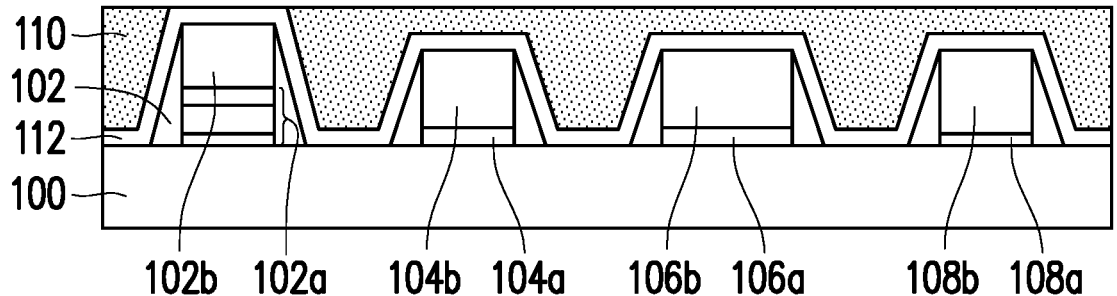
FIG. 1A to FIG. 1B are drawings, schematically illustrating a processing flow for fabricating various gate structure as looked into, according to an embodiment of the invention.
Figure 1B:
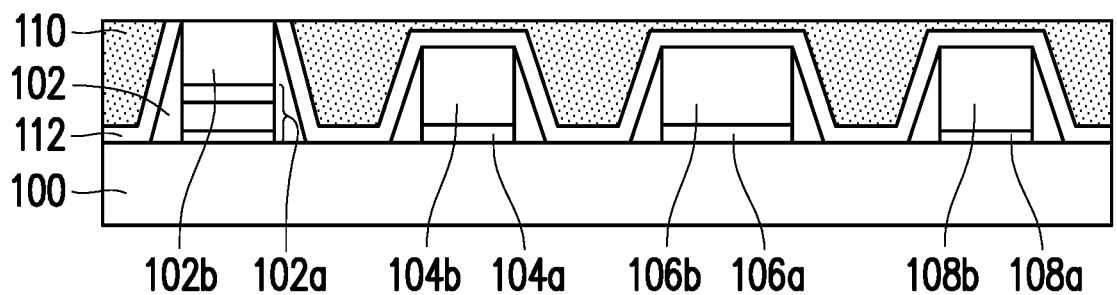

FIG. 1A to FIG. 1B are drawings, schematically illustrating a processing flow for fabricating various gate structure as looked into, according to an embodiment of the invention.

Referring to FIG. 1A, during fabrication, various dummy gates 102b, 104b, 106b, 108b with the gate insulating layers 102a, 104a, 106a, 108a are formed on the same substrate 100. Taking a flash memory apparatus as an example, a memory cell usually includes a control gate and a selection gate, which are insulated from the substrate 100 by the gate insulating layer 102a and the gate insulating layer 104a. The control gate and the selection gate may be a structure of metal gate, so the dummy gate 102b and the dummy gate 104b are formed first and would be replaced by the metal gate later. Thus, the dummy gate 102b and the dummy gate 104b would be removed later. Likewise, the dummy gate 106b for input/output (I/O) device and the dummy gate 108b for the core circuit are also removed later for replacing with the metal gate.

As looked into in the invention, the gate insulating layer 102a under the control gate is for storing charges to have the memory capability and then usually is an oxide/nitride/oxide (ONO) structure. The other gate insulating layers 104a, 106a, 108a in thickness is less than the gate insulating layers 102a. As a result, the gate heights for the dummy gates 102b, 104b, 106b and 108b are not the same, in which the dummy gates 102b is higher than the others.

The subsequent fabricating processes are performed to form the spacer 102 on the sidewall of the dummy gates 102b, 104b, 106b, 108b and the gate insulating layers 102a, 104a, 106a, 108a. An inter-layer dielectric (ILD) layer, including the nitride layer 112 and the oxide layer 110 are formed over the dummy gates 102b, 104b, 106b, 108b. To remove the dummy gates 102b, 104b, 106b, 108b, a polishing process is performed to first polishing the oxide layer 110 at the first stage, so the nitride layer 112 is exposed.

Referring to FIG. 1B, the polishing process keeps on until the highest dummy gate 102b is exposed. However, the other dummy gates 104b, 106b, 108b may be not fully exposed after the polishing process to expose the dummy gates 102b, due to less thickness of the gate insulating layers 104a, 106a, 108a.

The structure of FIG. 1B as looked into in the invention is that the dummy gates 104b, 106b, 108b may be not successfully removed while the exposed dummy gate 102a is removed in the etching process. As a result, the dummy gates 104b, 106b, 108b may remain without replacing with metal gate as expected in design.

After looking into the issue to remove the various dummy gates, in an embodiment, the invention provides a method to fabricate various gate structures.

FIG. 2A to FIG. 2K are drawings, schematically illustrating a processing flow for fabricating various gate structure as looked into, according to an embodiment of the invention.

Figure 2A:
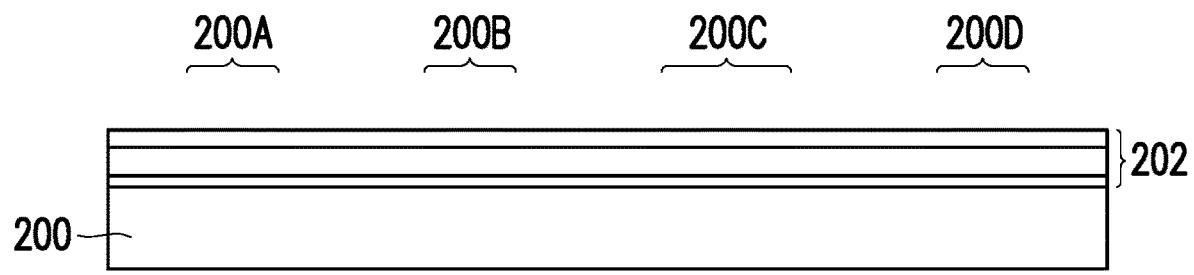
FIG. 2A to FIG. 2K are drawings, schematically illustrating a processing flow for fabricating various gate structure as looked into, according to an embodiment of the invention.

Referring to FIG. 2A, a substrate 200 has been configured to have multiple regions 200A, 200B, 200C, 200D, at which various gate structures would be fabricated later. A gate insulating layer 202 is globally formed on the substrate 200. The gate insulating layer 202 is the one corresponding to a gate structure in the various gate structures formed on the substrate 200 and having the largest thickness. Taking a flash memory cell as an example, the gate insulating layer 202 may be the charge storage layer, such as ONO structure under the control gate. Alternatively, gate insulating layer 202 may be for the high-voltage transistor, which usually needs thicker gate insulating layer with respect to high operation voltages. However, the gate insulating layer 202 with the largest thickness is not limited to the specific gate structure.

In an example, the region 200A is preserved to form the control gate. The region 200B in an example is preserved to form the selection gate with respect to the control gate. The region 200C in an example is preserved to form the gate structures for I/O transistors. Further, the region 200D in an example is preserved to form the gate structures for the core transistors in the control circuit. However, the invention is not just limited to the embodiments above.

Figure 2B:
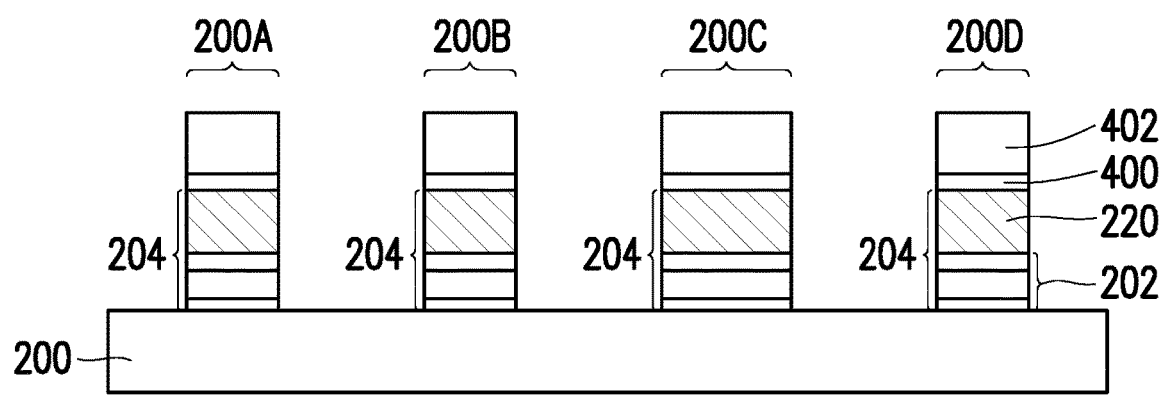

Referring to FIG. 2B, in an embodiment, a dummy gate layer 220 and the mask stack layer, including nitride layer 400 and oxide layer 402, are formed over the gate insulating layer 202. A patterning process is performed on the mask stack layer, the dummy gate layer 220 and the gate insulating layer 202 to form various dummy gate structures 204, which includes the dummy gate layer 220 and the gate insulating layer 202. The mask stack layer of nitride layer 400 and oxide layer 402 would be removed later.

As noted, all of the regions 200A, 200B, 200C, 200D have been formed with the same dummy structures 204 at the current fabrication stage.

Figure 2C:
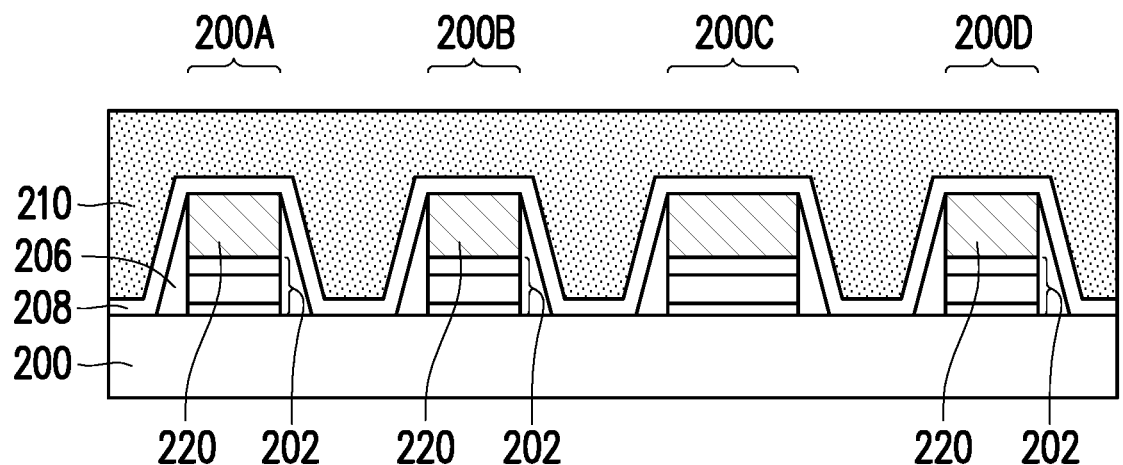

Referring to FIG. 2C, a spacer 206 is formed on side wall of the dummy structures 204. A nitride layer 208 is covering over the dummy structures 204 and the substrate 200 as a conformal layer. The nitride layer 208 may be treated as a liner layer. An oxide layer 210 is deposited on the nitride layer 208 to further fill the gap between the dummy gate structures 204. Generally, the nitride layer 208 and the oxide layer 210 together are referred as an inter-layer dielectric (ILD) layer.

Figure 2D:
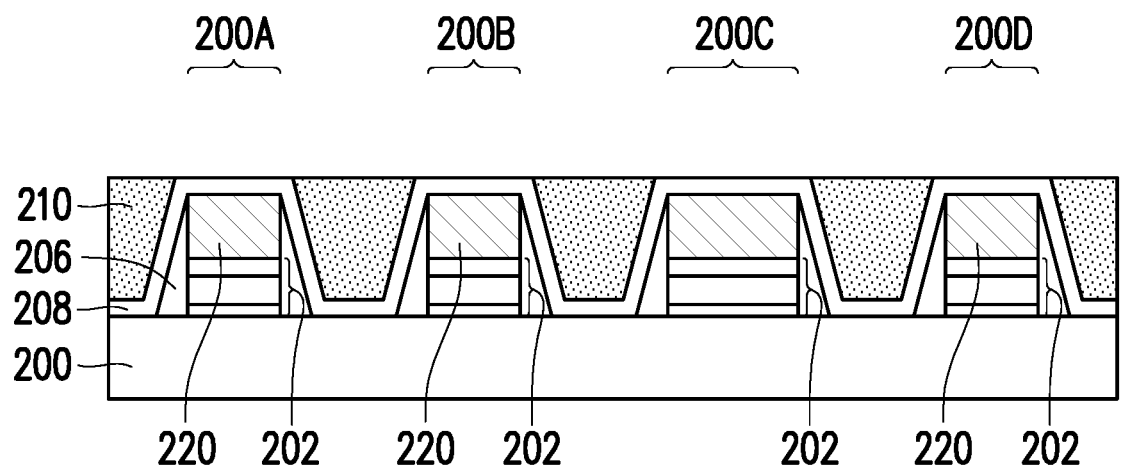

Referring to FIG. 2D, a polishing process is performed on the oxide layer 210 at this stage to expose the nitride layer 208. As noted, the dummy gate layer 220 in the regions 200A, 200B, 200C, 200B are at the same height, so that the nitride layer 208 are substantially exposed in equal condition.

Figure 2E:
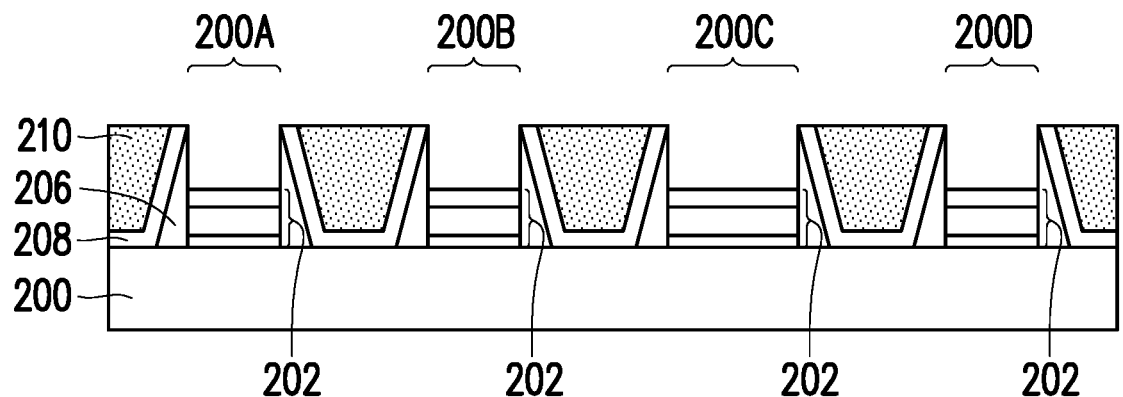

Referring to FIG. 2E, the polishing process is continuously performed to polish the nitride layer 208 to expose the dummy gate layer 220. Then, all of the dummy gate layer 220 in the regions 200A, 200B, 200C, 200B are removed to expose the gate insulating layer 202. In this manner, all of the dummy gate layer 220 are exposed and removed. This result would assure that the dummy gate layer 220 in the regions 200A, 200B, 200C, 200B may be removed, completely.

Figure 2F:
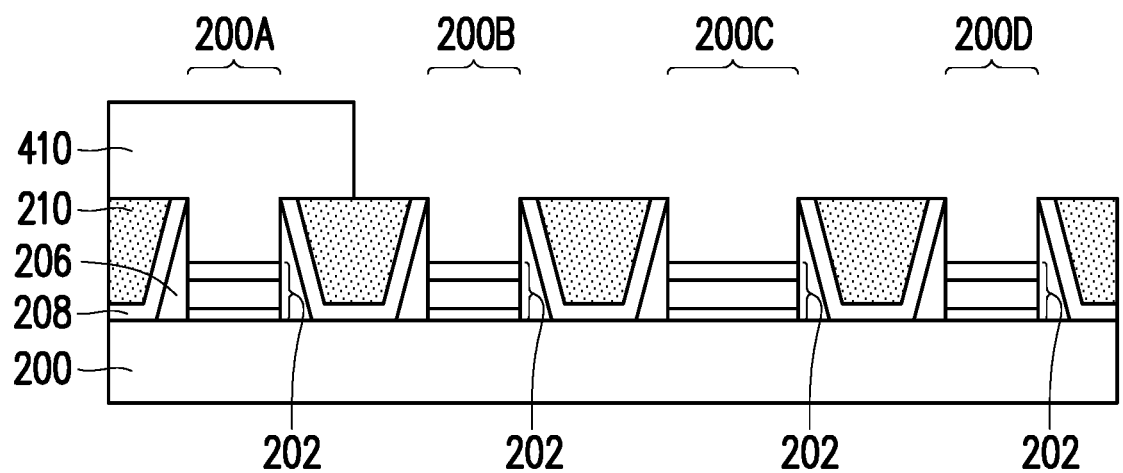

Referring to FIG. 2F, since the gate insulating layer 202 in the region 200A is indeed needed to provide as the charge storage layer, such as ONO layer, under the control gate, a photoresist layer 410 is formed to mask the gate insulating layer 202 in the region 200A and exposed the other portion of the gate insulating layer 202.

Figure 2G:
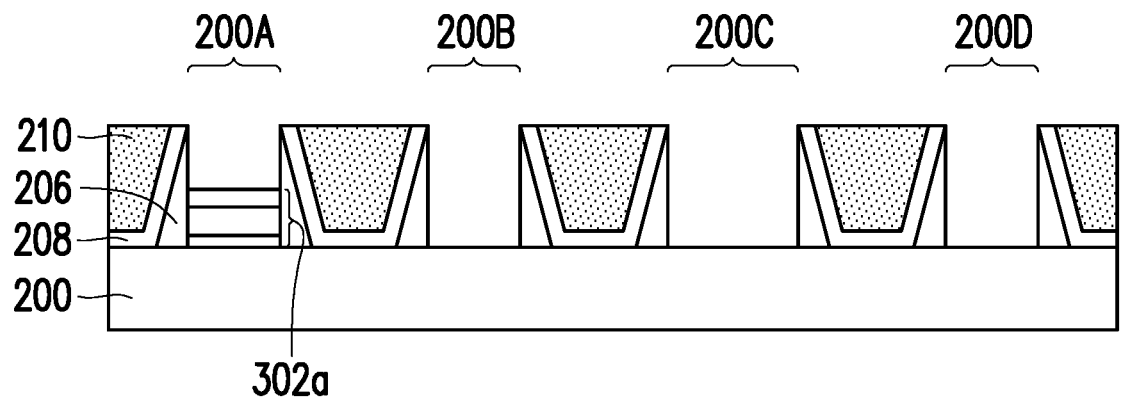

Referring to FIG. 2G, the exposed portion of the gate insulating layer 202 is removed to expose the substrate 200 in the regions 200B, 200C, 200D by etching process in an embodiment. The photoresist layer 410 is also removed. The remaining portion of the gate insulating layer 202 now is referred as the gate insulating layer 302a, which is actually needed in the device.

Figure 2H:
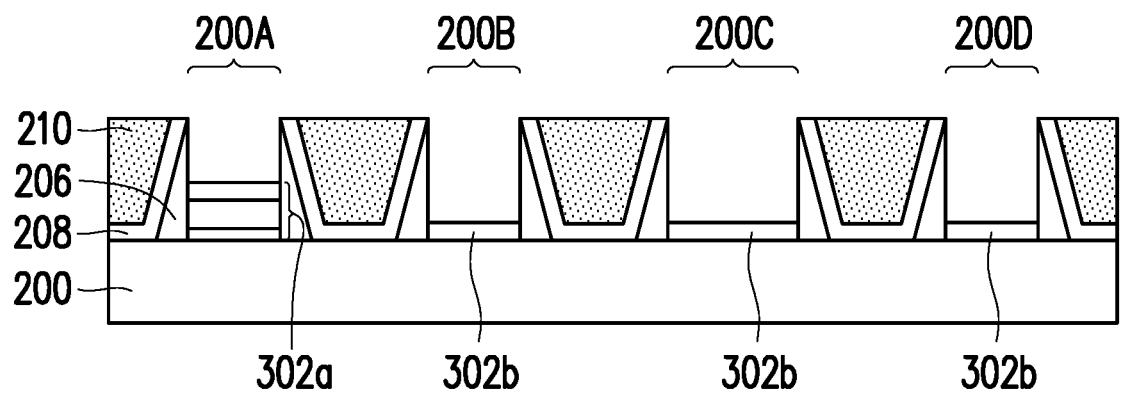

Referring to FIG. 2H, another gate insulating layer 302b to be used in the region 200B, 200C for selection gate and/or I/O gate in an embodiment is formed on the exposed surface of the substrate 200 by thermal oxidation. The thickness of the gate insulating layer 302b is less than the gate insulating layer 302a in the region 200A.

A difference in thickness between the gate insulating layer 302a and the gate insulating layer 302b may be 5 nm or more, in an embodiment. However, in the embodiment, the dummy gate layer 220 may be successfully removed to free the space as occupied by the dummy gate layer 220.

Figure 2I:
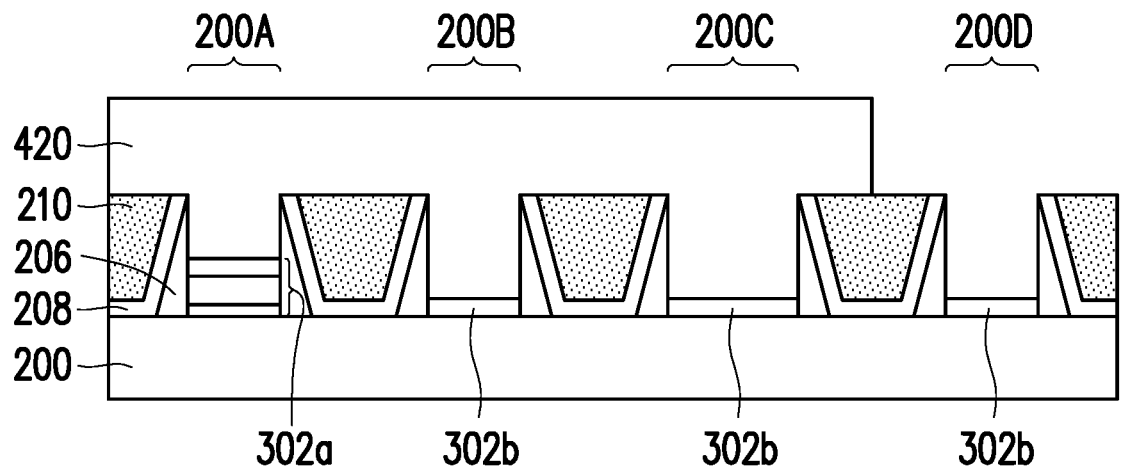

Referring to FIG. 2I, some other transistors for other circuit, such as control circuit or core circuit may needs another gate insulating layer. A photoresist layer 420 is formed to cover the gate insulating layer 302a and the gate insulating layer 302b, which are intended. A portion of the gate insulating layer 302b as not intended at the region 200D is exposed.

Figure 2J:
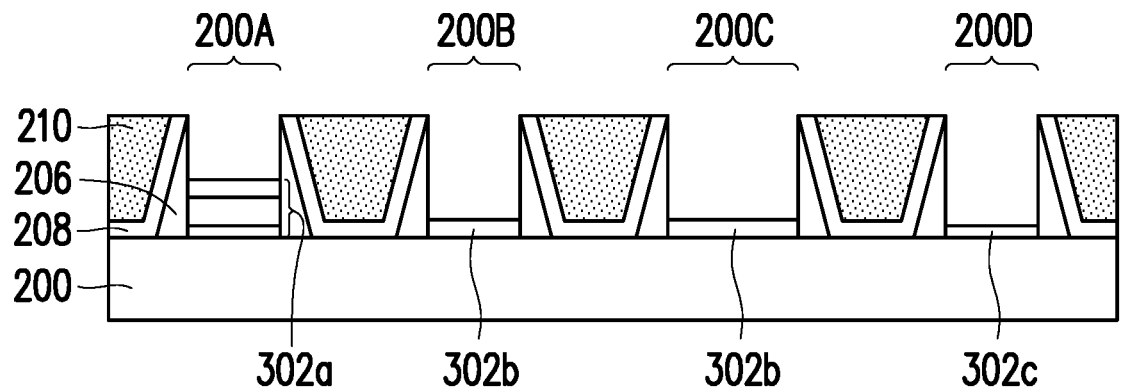

Referring to FIG. 2J, with the photoresist layer 420 as a mask, the gate insulating layer 302b in the region 200D is removed, the photoresist layer 420 is then removed and another gate insulating layer 302c is formed on the surface of the substrate 200. The gate insulating layer 302c may be even thinner for forming the transistors for the core circuit.

In the embodiment above, the steps of forming the gate insulating layer 302c is performed after the steps of forming the gate insulating layer 302b. However, the invention is not just limited to the embodiment above. In another embodiment, the steps of forming the gate insulating layer 302c may be performed before the steps of forming the gate insulating layer 302b.

Figure 2K:
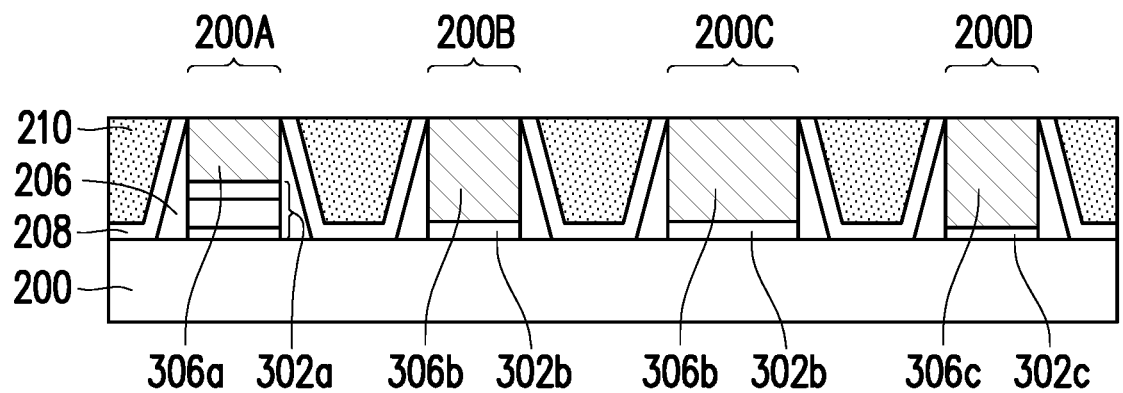

Referring to FIG. 2K, the space as previously released by the dummy gate layer 220 is formed with metal gates 306a, 306b, 306c, which have better conductivity than polysilicon. The dummy gate layer 220 as usually formed by the polysilicon is then replaced by metal gates. Further, the structure of metal gate in an embodiment may be a stack of a dielectric layer, a work function metal layer and a filling metal layer, as described in FIG. 3.

Figure 3:
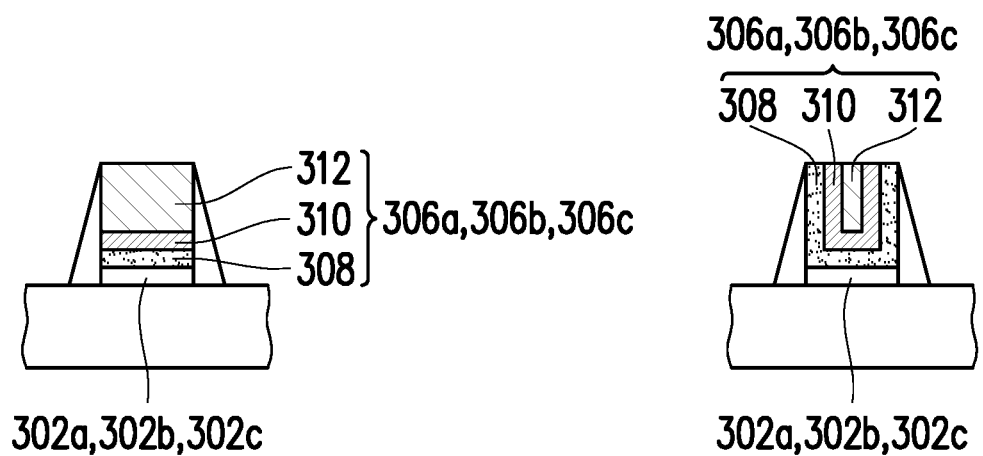
FIG. 3 is a drawing, schematically illustrating the metal gate as fabricated, according to an embodiment of the invention.

FIG. 3 is a drawing, schematically illustrating the metal gate as fabricated, according to an embodiment of the invention. Referring to FIG. 3, to form the metal gate, a dielectric layer 308, such as a high dielectric constant (high-K) dielectric, is additionally formed on the gate insulating layers 302a, 302b, 302c. A work function metal layer 310 is the formed on the dielectric layer 308. A filling metal layer 312 is formed on the work function metal layer 310 to fill the release space. As a result, the metal gates 306a, 306b, 306c are formed at all of the regions 200A, 200B, 200C, 200D. Depending on the choice of the fabrication process, the stack structure of the metal gates 306a, 306b, 306c may different without limiting to a specific metal gate.

The embodiments have proposed a method for the fabrication various gate structures on the substrate. The invention may assure that the dummy gate layer may be successfully removed to release the space for forming metal gate later.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A method for fabricating gate structures, comprising:
providing a substrate, configured to have a first region, a second region, and a third region;
forming dummy gate structures on the substrate at the first region, the second region, and the third region, wherein each of the dummy gate structures has a first gate insulating layer on the substrate and a dummy gate on the first gate insulating layer;
forming an inter-layer dielectric layer over the dummy gate structures;
polishing the inter-layer dielectric layer to expose all of the dummy gates;
removing the dummy gates, to expose the first gate insulating layer at the first region, the second region, and the third region;
removing the first gate insulating layer at the second region, and the third region;
forming a second gate insulating layer on the substrate only at the second region, wherein the first gate insulating layer is thicker than the second gate insulating layer;
forming a third gate insulating layer on the substrate at the third region, wherein the second gate insulating layer is thicker than the third gate insulating layer; and
forming metal gates, on the first gate insulating layer, the second gate insulating layer, and the third gate insulating layer.

2. The method for fabricating gate structures in claim 1, wherein a thickness difference between the first gate insulating layer and the second gate insulating layer is at least 5 nm.

3. The method for fabricating gate structures in claim 1, wherein the first gate insulating layer is an oxide/nitride/oxide layer and the second gate insulating layer is an oxide layer.

4. The method for fabricating gate structures in claim 3, wherein the metal gates comprise a control gate on the first gate insulating layer and a selection gate on the second gate insulating layer.

5. The method for fabricating gate structures in claim 1, wherein the step of forming the metal gates comprises forming a third gate insulating layer, a work function metal layer and a filling metal layer.

6. The method for fabricating gate structures in claim 1, wherein the step of forming the second gate insulating layer comprises forming at least one group of the second gate insulating layers with at least one thickness corresponding to the at least one group.

7. The method for fabricating gate structures in claim 6, wherein the at least one group of the second gate insulating layers comprises at least one of a group for an input/output transistor, a group for selection gate of a flash memory cell, a group for a core transistor.

8. The method for fabricating gate structures in claim 1, wherein widths for the first gate insulating layer and the second gate insulating layer are same or different.

9. The method for fabricating gate structures in claim 1, wherein a structure of the metal gates is a single metal layer or a stack structure.

10. The method for fabricating gate structures in claim 1, wherein the step of forming the dummy gate structures comprises forming a spacer on a sidewall of the dummy gate with the first gate insulating layer.

11. The method for fabricating gate structures in claim 1, wherein the step of forming the inter-layer dielectric layer comprises:
forming a liner layer over the dummy gate structures; and
forming an oxide layer on the liner layer.

12. The method for fabricating gate structures in claim 1, wherein the second insulation layer is a thermal oxide layer by a thermal oxidation process on the substrate at the second region after the first gate insulation layer at the second region is removed.

13. A method for fabricating gate structures, comprising:
providing a substrate, configured to have a first region, a second region, and a third region;
forming a charge storage layer on the substrate at the first region, second region, and the third region;
forming a dummy gate layer on the charge storage layer;
patterning the dummy gate layer and the charge storage layer into dummy gate structures at the first region, second region, and the third region;
forming a spacer on a sidewall of the dummy gate structures;
forming an inter-layer dielectric layer over the dummy gate structures;
polishing the inter-layer dielectric layer to expose all of the dummy gates;
removing the dummy gate layer in the dummy gate structures to expose the charge storage layer at the first region, the second region, and the third region;
removing the charge storage layer at the second region, and the third region;
forming a second gate insulating layer on the substrate only at the second region, wherein the charge storage layer as a first gate insulating layer is thicker than the second gate insulating layer;
forming a third gate insulating layer on the substrate at the third region, wherein the second gate insulating layer is thicker than the third gate insulating layer; and
forming metal gates, on the charge storage layer, the second gate insulating layer, and the third gate insulating layer.

14. The method for fabricating gate structures in claim 13, wherein a thickness difference between the charge storage layer and the second gate insulating layer is at least 5 nm.

15. The method for fabricating gate structures in claim 13, wherein the metal gates comprise a control gate on the charge storage layer and a selection gate on the second gate insulating layer.

16. The method for fabricating gate structures in claim 13, wherein the step of forming the second gate insulating layer comprises forming at least one group of the second gate insulating layers with at least one thickness corresponding to the at least one group.

17. The method for fabricating gate structures in claim 16, wherein the at least one group of the second gate insulating layers comprises at least one of a group for an input/output transistor, a group for selection gate of a flash memory cell, a group for a core transistor.

18. The method for fabricating gate structures in claim 13, wherein widths for the first gate insulating layer and the second gate insulating layer are same or different.

19. The method for fabricating gate structures in claim 13, wherein the step of forming the inter-layer dielectric layer comprises:
forming a liner layer over the dummy gate structures; and
forming an oxide layer on the liner layer.

20. The method for fabricating gate structures in claim 13, wherein the second insulation layer is a thermal oxide layer by a thermal oxidation process on the substrate at the second region after the first gate insulation layer at the second region is removed.

* * * * *